US009543443B2

(12) United States Patent
Sun et al.

(10) Patent No.: US 9,543,443 B2
(45) Date of Patent: Jan. 10, 2017

(54) THIN FILM TRANSISTOR ASSEMBLY, ARRAY SUBSTRATE METHOD OF MANUFACTURING THE SAME, AND DISPLAY DEVICE

(71) Applicant: BOE TECHNOLOGY GROUP CO., LTD., Beijing (CN)

(72) Inventors: Shuang Sun, Beijing (CN); Fangzhen Zhang, Beijing (CN); Jing Niu, Beijing (CN); Zhijun Lv, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/777,666

(22) PCT Filed: Feb. 27, 2015

(86) PCT No.: PCT/CN2015/073341
§ 371 (c)(1),
(2) Date: Sep. 16, 2015

(87) PCT Pub. No.: WO2016/074373
PCT Pub. Date: May 19, 2016

(65) Prior Publication Data
US 2016/0141425 A1    May 19, 2016

(30) Foreign Application Priority Data

Nov. 14, 2014    (CN) .......................... 2014 1 0645972

(51) Int. Cl.
*H01L 29/786* (2006.01)
*H01L 27/12* (2006.01)
*H01L 29/417* (2006.01)

(52) U.S. Cl.
CPC ....... *H01L 29/78675* (2013.01); *H01L 27/124* (2013.01); *H01L 27/1288* (2013.01);
(Continued)

(58) Field of Classification Search
CPC .. H01L 21/336; H01L 29/786; H01L 27/1248; H01L 27/1262
See application file for complete search history.

(56) References Cited

U.S. PATENT DOCUMENTS

2005/0258488 A1   11/2005  Chang et al.
2011/0101353 A1*  5/2011  Park ................. H01L 29/78633
                                               257/59
2013/0248870 A1   9/2013  Jung et al.

FOREIGN PATENT DOCUMENTS

CN        202473925     10/2012
CN        103018989      4/2013
(Continued)

OTHER PUBLICATIONS

International Search Report and Written Opinion from PCT Application Serial No. PCT/CN2015/073341, dated Jul. 17, 2015, 11 pages.

(Continued)

*Primary Examiner* — Elias M Ullah
(74) *Attorney, Agent, or Firm* — Kinney & Lange, P.A.

(57) ABSTRACT

The present disclosure discloses a thin film transistor assembly, an array substrate and a method of manufacturing the same, and a display device including the array substrate. The array substrate includes a substrate; a plurality of thin film transistors formed on the substrate; and a plurality of light shielding layers, each of the light shielding layers being arranged between a source electrode and a drain electrode of the thin film transistor and configured to block light from the exterior from illuminating an active layer of the thin film transistor. The light shielding layer and the source electrode and the drain electrode of the thin film transistor are formed in the same layer on the substrate. As the light shielding layer, the source electrode and the drain electrode of the thin film transistor and a data line may be formed on the substrate (Continued)

by using the same material layer through a single patterning process, times of performing patterning processes and the number of masks used may be reduced and thus manufacturing process and cost of the array substrate may be decreased.

19 Claims, 7 Drawing Sheets

(52) U.S. Cl.
CPC .. *H01L 29/41733* (2013.01); *H01L 29/78633* (2013.01); *H01L 29/78696* (2013.01)

(56) References Cited

FOREIGN PATENT DOCUMENTS

| | | |
|---|---|---|
| CN | 103367165 A | 10/2013 |
| CN | 203312302 U | 11/2013 |
| CN | 104332477 A | 2/2015 |

OTHER PUBLICATIONS

First Chinese Office Action dated Aug. 19, 2016, for corresponding Chinese Application No. 201410645972.6.

* cited by examiner

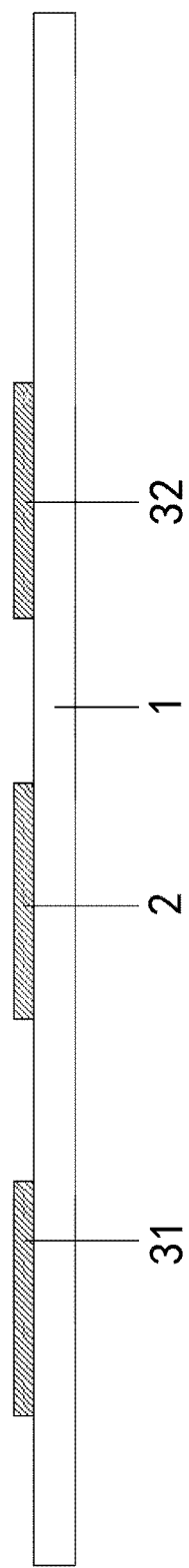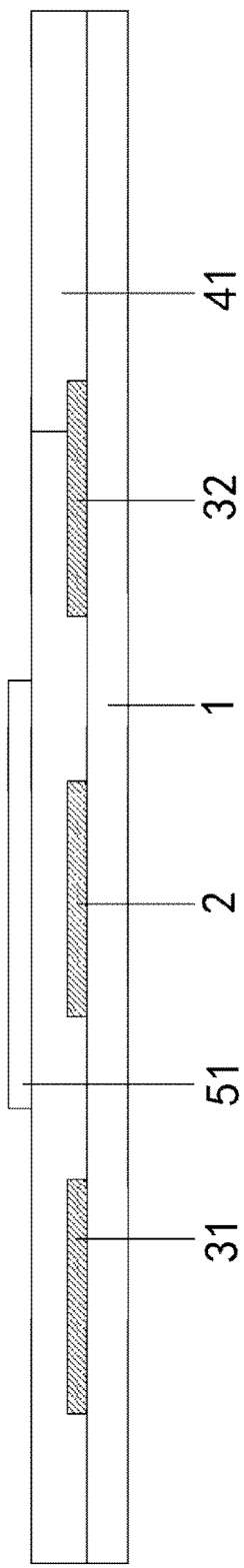

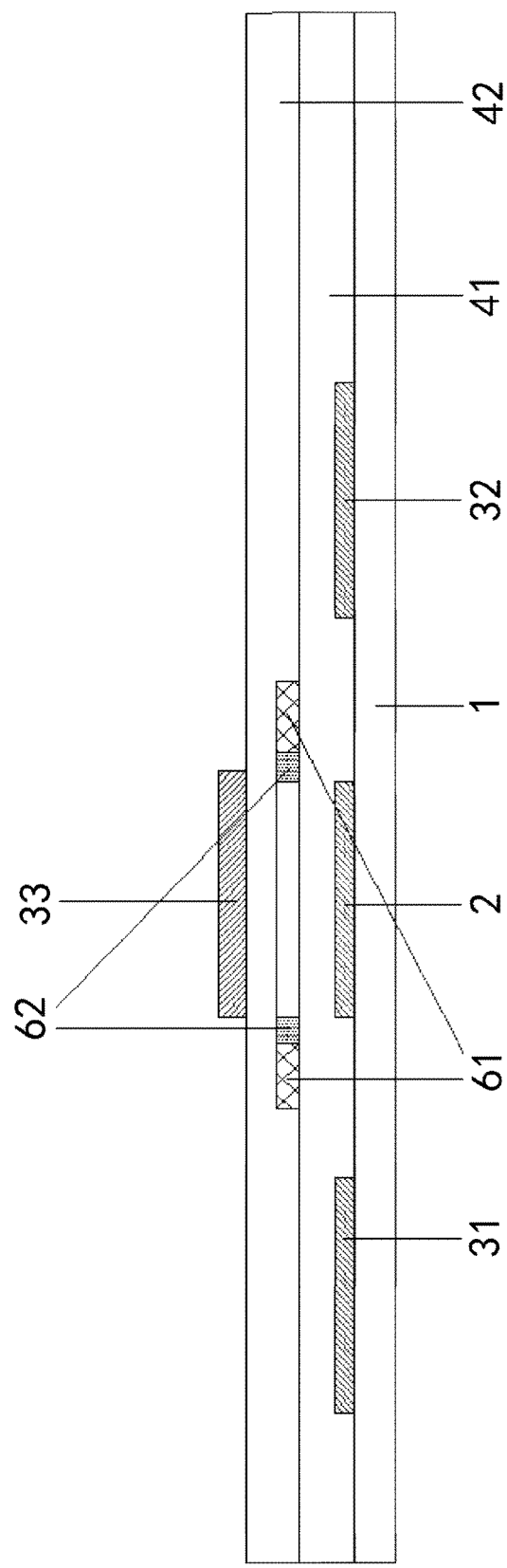

THIN FILM TRANSISTOR ASSEMBLY, ARRAY SUBSTRATE METHOD OF MANUFACTURING THE SAME, AND DISPLAY DEVICE

BACKGROUND OF THE INVENTION

Field of the Invention

Embodiments of the present invention relate to a display device, and particularly to a thin film transistor assemble, an array substrate and a method of manufacturing the same, and a display device including the array substrate.

Description of the Related Art

Thin film transistors, which are currently widely used in a thin film transistor liquid crystal display (TFT-LCD) display device, an Organic Light Emitting Diode (OLED) display device and an Active Matrix Organic Light Emitting Diode (AMOLED) display device, mainly include amorphous silicon thin film transistors and poly-silicon thin film transistors. Low temperature poly-silicon (LTPS) technology has been applied in manufacturing processes of a thin film transistor display, in which an amorphous silicon film is transformed into a poly-silicon film by an excimer laser annealing process. Compared to the amorphous silicon ($\alpha$-Si), a mobility ratio of the poly-silicon film produced in this way has been increased by a factor of 100. For example, the electron mobility ratio is increased up to 200 $cm^2$/V-sec or more. Thus, the area of the thin film transistors can be effectively reduced and aperture ratio of a display is increased. Further, the total power consumption of the display is decreased while brightness thereof is improved. In addition, a display produced by means of LTPS technology has an improved response time, a higher revolution and better image displaying quality.

Generally, in a top gate thin film transistor comprising an active layer that is formed by using the poly-silicon film, a source electrode, a drain electrode and a data line connected to the source electrode thereof are formed on a glass substrate, a gate electrode is formed above the source electrode and the drain electrode while the active layer is located between the gate electrode and the source and drain electrodes. In addition, a light shielding layer is provided between the active layer and the glass substrate to block illumination of light introduced from the glass substrate on the active layer, which illumination will affect electrical characteristic of the low temperature poly-silicon film used to form the active layer. During production of the array substrate, a plurality of patterning processes are usually needed to respectively form the source electrode, the drain electrode, the light shielding layer and the gate electrode, in which masks for the patterning processes each have different patterns. As the masks are expensive, the process of manufacturing the array substrate including a plurality of patterning processes is complex and high in cost.

SUMMARY OF THE INVENTION

Embodiments of the present invention provide a thin film transistor assembly, an array substrate and a method of manufacturing the same, and a display device including the array substrate, which enables reduced patterning processes and a decreased number of used masks.

According to an embodiment of the present invention, there is provided a thin film transistor assembly, comprising: a thin film transistor; and, a light shielding layer, arranged between a source electrode and a drain electrode of the thin film transistor and configured to block light from the exterior from illuminating an active layer of the thin film transistor, wherein the light shielding layer and the source electrode and drain electrode of the thin film transistor are formed in the same layer.

According to an embodiment of the present invention, there is provided an array substrate, comprising: a substrate; and a plurality of thin film transistor assemblies according to any of the above embodiments, the plurality of thin film transistor assemblies being formed on the substrate, wherein the light shielding layer and the source electrode and drain electrode of the thin film transistor are formed in the same layer.

According to a still embodiment of the present invention, there is provided a method of manufacturing an array substrate, the array substrate comprising: a substrate; a plurality of top gate thin film transistor assemblies, which are formed on the substrate; and a plurality of light shielding layers, which each are disposed between a source electrode and a drain electrode of the thin film transistor on the substrate and are configured to block light from the substrate from illuminating an active layer of the corresponding thin film transistor. The method includes a step of forming the source electrode, the light shielding layer and the drain electrode spaced from one another in that order by a single mask through a single patterning process on the substrate.

According to a further embodiment of the present invention, there is provided a display device comprising the array substrate according to any of the above embodiments.

BRIEF DESCRIPTION OF THE DRAWINGS

In order to make the object, technical scheme and advantages of the present invention more clear, the present invention is further described in detail by reference to embodiments in combination with the drawings, in which:

FIG. 2a-2g illustrate procedure of a method of manufacturing an array substrate according to an exemplary embodiment of the present invention.

DETAILED DESCRIPTION OF PREFERRED EMBODIMENTS OF THE INVENTION

Exemplary embodiments of the present disclosure will be described hereinafter in detail with reference to the attached drawings. In this description the similar reference number refers to the similar component. In the following detailed description, for purposes of explanation, numerous specific details are described by reference to the drawings in order to provide a thorough understanding of the disclosed embodiments. It will be apparent, however, that one or more embodiments may be not used to limit the present invention.

According to a general concept of embodiments of the present invention, there is provided an array substrate, comprising: a substrate; a plurality of thin film transistors formed on the substrate; and, a plurality of lighting shielding layer, each of the plurality of lighting shielding layer being located on the substrate between a source electrode and a drain electrode of the thin film transistor and configured to be able to block light from illuminating an active layer of the corresponding thin film transistor from a side of the substrate; wherein the light shielding layer and the source electrode and the drain electrode of the thin film transistor are formed in the same layer. The light shielding layer and the source electrode and the drain electrode of the thin film transistor may be formed by the same material layer through a single patterning process. At this instance, as the light shielding layer and the source electrode and the drain electrode of the thin film transistor may be formed by the same material layer through a single patterning process, times of performing patterning processes may be reduced and thus the number of masks for the patterning processes may be decreased, thereby simplifying the process of manufacturing the array substrate, saving time and cost for delivery of glass substrates among various apparatuses for forming films, and reducing manufacturing cost.

In the below description, many specific details are described for interpretation so as to provide a full understanding of embodiments of the present disclosure. However, one or more embodiments without these details may be implemented. In other situations, known structures and devices are illustrated in graphical representation in order to simplify the drawings.

Figure 1:
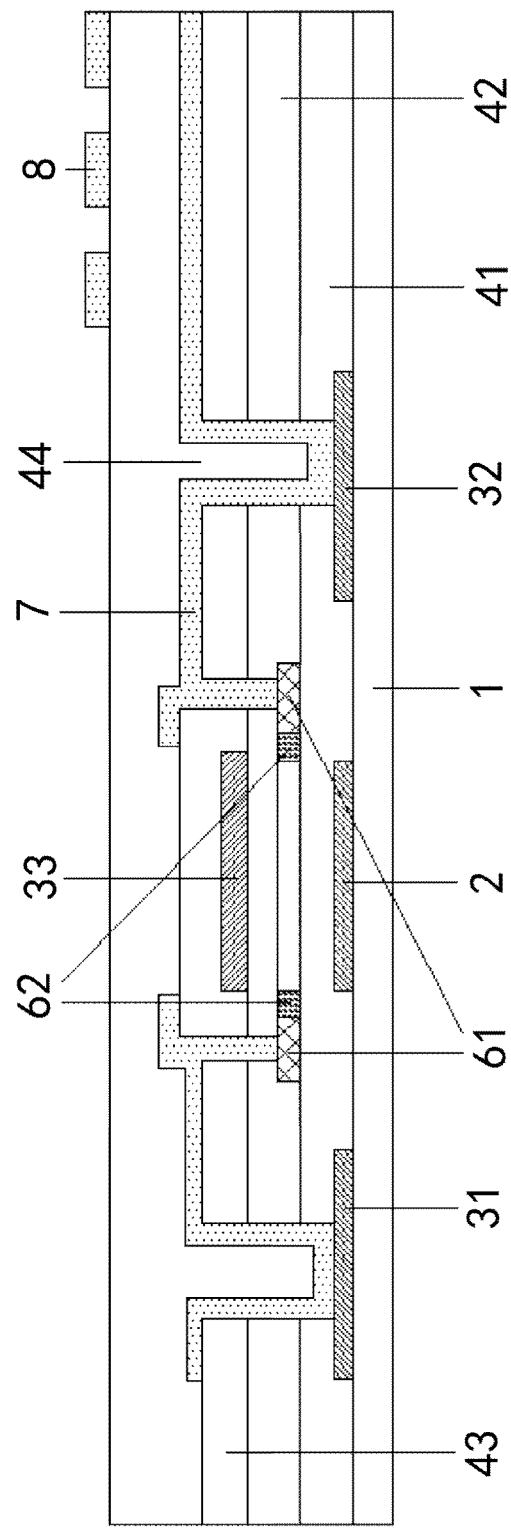
FIG. 1 is a partial sectional view of an array substrate according to an exemplary embodiment of the present invention.

FIG. 1 is a schematic partial sectional view of an array substrate according to an exemplary embodiment of the present invention. As shown in FIG. 1, the array substrate according to the embodiment includes a substrate 1 made of glass or transparent resin material, a plurality of thin film transistors and a light shielding layer 2. A source electrode 31, a drain electrode 32 and a gate electrode 33 of each of the thin film transistors are electrically connected to a corresponding data line (not shown), a pixel electrode 7 and a gate line (not shown) respectively. In an embodiment of the present invention, the thin film transistor may be a top gate thin film transistor, in which the gate electrode 33 is located above an active layer 5 and a second insulating layer 42 is disposed as a gate insulating layer between the active layer 5 and the gate electrode 33, i.e., the gate electrode 33 is located downstream of the active layer 5 in a direction away from the substrate 1.

According to an embodiment of the present invention, the thin film transistors are formed on the substrate 1. The light shielding layer 2 is formed on the substrate 1 and is configured to shield light from the substrate 1 produced, for example, from an external light source from illuminating the active layer 5 of the corresponding thin film transistor. The light shielding layer 2, and the source electrode 31 and the drain electrode 32 of the thin film transistor are formed in the same layer on the substrate 1. The arrangement of the light shielding layer 2 can prevent properties of the active layer 5 from being changed due to illumination of light, thereby increasing reliability of the device.

In an embodiment of the present invention, the light shielding layer 2 and the source electrode 31 and the drain electrode 32 of the thin film transistor are formed in the same layer on the substrate 1. In this instance, the light shielding layer 2, the source electrode 31 and the drain electrode 32 may be formed by the same metal film through a single patterning process, thereby reducing times of performing patterning processes and decreasing the number of the masks for patterning. The metal film may be formed by any one of molybdenum, aluminium, aluminium-nickel alloy, molybdenum-tungsten alloy, chromium and copper alloy, and may be also formed by a random combination of these materials. A thickness and material of the metal film may be determined according to specific application. The light shielding layer 2 is disposed between the source electrode 31 and the drain electrode 32 and is located to correspond to the active layer 5, thereby blocking light introduced from the substrate 1 from illuminating the active layer, maintaining electrical characteristic of the active layer 5 and improving performance of the thin film transistor. For example, the light shielding layer 2 is formed from chromium or molybdenum metal film. The chromium or molybdenum metal film exhibits good light-shielding and etched properties and thus may be applied to improve performance of the array substrate. The arrangement of the light shielding layer 2 may protect the active layer 5 from being illuminated by light, thereby avoiding properties of the active layer 5 from being changed and thus improving reliability of the device. Further, as the light shielding layer 2, the source electrode 31 and the drain electrode 32 are formed through a single patterning process, times of performing patterning processes, number of masks used and complexity and time period of the process are decreased.

In an exemplary embodiment of the present invention, the active layer 5 of the thin film transistor is formed by a poly-silicon film (for example, a low temperature poly-silicon), and thus the thin film transistor in the embodiment is a low temperature poly-silicon thin film transistor (LTPS-TFT). As the active layer formed by the poly-silicon film has an electron mobility up to 200 $cm^2$/V-sec or more, area of the thin film transistor may be effectively reduced, which thus renders aperture ratio and brightness of a display device to be increased while entire power consumption thereof is decreased. In addition, as electrical properties of an active layer formed by a poly-silicon film are more prone to be affected by light illumination and the light shielding layer 2 may be arranged to block light introduced from the substrate 1 from illuminating the active layer 5, electrical properties of the active layer 5 may be maintained and thus characteristic of the thin film transistor may be improved.

In an exemplary embodiment of the present invention, the source electrode 31 of each of the thin film transistors is connected to a corresponding data line and, the data line, the light shielding layer 2, the source electrode 31 and the drain electrode 32 are formed in the same layer on the substrate 1. In this way, times of performing patterning processes may be further reduced, masks used may be decreased in number and time for delivering glass substrate among apparatuses for a plurality of process steps may be saved.

In an exemplary embodiment of the present invention, doped ohmic contact areas 61 are provided in portions of the active layer 5 connected to the source electrode 31 and the drain electrode 32. The doped ohmic contact areas 61 may be doped by phosphor or boron. Through the doped ohmic contact areas 61, contact resistance between the source electrode 31 and the drain electrode 32, and the active layer 5 and the pixel electrode 7 may be reduced. The thin film transistor may be a p-type thin film transistor or an N-type thin film transistor. In an N-type thin film transistor, lightly doped drain (LDD) areas 62 are further provided around the doped ohmic contact areas 61 to prevent hot electron degradation effect and extend lifetime of hot carriers of the thin film transistor.

As shown in FIG. 1, according to an embodiment of another aspect of the present invention, there is provided a thin film transistor assembly, comprising: a thin film transistor and a light shielding layer 2. The light shielding layer 2 is disposed between a source electrode 31 and a drain electrode 32 of the thin film transistor and is configured to block light from the exterior of the thin film transistor from illuminating an active layer 5 of the thin film transistor; wherein the light shielding layer 2 and the source electrode 31 and the drain electrode 32 of the thin film transistor are formed in the same layer.

Although a top gate thin film transistor is shown in FIG. 1, the present invention is not limited to this. In an alternative embodiment of the present invention, the thin film transistor is a bottom gate thin film transistor and a light shielding layer 2 is located between the source electrode 31 and the drain electrode 32 of the thin film transistor.

According to the thin film transistor assembly of the embodiment of the present invention, the light shielding layer 2 and the source electrode 31 and the drain electrode 32 may be formed from the same material layer through a single patterning process, which renders reduced times of performing patterning processes and decreased masks used and thus simplifies manufacturing process and cost of the thin film transistor assembly. As the light shielding layer is provided between the source electrode 31 and the drain electrode 32 and is located to correspond to the active layer in position, the light introduced from the substrate is blocked from illuminating the active layer, thereby maintaining electrical characteristic of the active layer and improving characteristics of the thin film transistor.

According to an embodiment of a further aspect of the present invention, there is provided a method of manufacturing an array substrate. The array substrate may include a substrate, a plurality of thin film transistors formed on the substrate, and a plurality of light shielding layers, each of the light shielding layers being disposed between a source electrode and a drain electrode of the thin film transistor on the substrate and is configured to block light introduced from the substrate from illuminating an active layer of the thin film transistor. The method of manufacturing the array substrate comprises forming, on the substrate, the source electrode, the light shielding layer and the drain electrode, which are separated from one another in that order, by using a single mask through a single patterning process. The method may comprises steps of: forming a first insulating layer covering the source electrode, the light shielding layer and the drain electrode; forming the active layer on the first insulating layer; forming a second insulating layer covering the active layer on the first insulating layer; forming a gate electrode on the second insulating layer; forming a third insulating layer covering the gate electrode on the second insulating layer; forming through holes in the first, second and third insulating layers to electrically connect the active layer and the source electrode and the drain electrode. In this way, the light shielding layer and the source electrode and the drain electrode of the thin film transistor may be formed from the same material layer through a single patterning process. For example, the light shielding layer and the source electrode and the drain electrode of the thin film transistor are formed from the same material layer through a single patterning process, thereby reducing times of performing patterning processes and the number of masks used and thus simplifying the manufacturing process of the substrate and decreasing manufacturing cost.

Figure 2C:
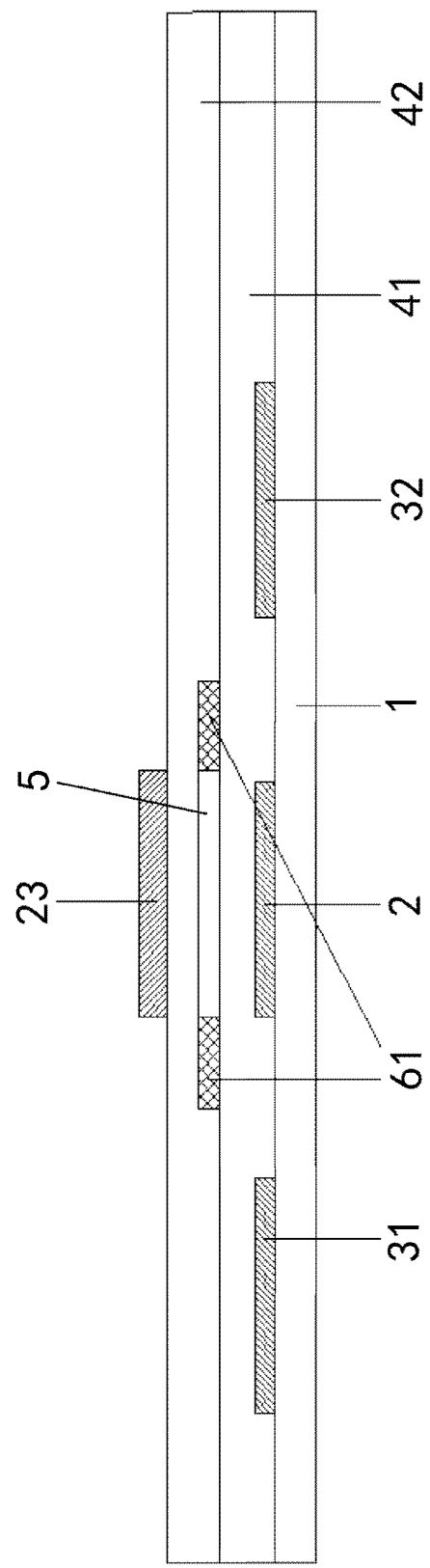

FIGS. 2a-2g illustrate schematic procedure drawings of a method of manufacturing an array substrate according to an exemplary embodiment of the present invention. The array substrate includes: a substrate 1; a plurality of thin film transistors formed on the substrate 1, which may be, for example, top gate thin film transistors; and a plurality of light shielding layers 2, each of the light shielding layers 2 being disposed between a source electrode 31 and a drain electrode 32 of the thin film transistor and being configured to block light introduced from the substrate 1 from illuminating an active layer of the thin film transistor. The method of manufacturing the array substrate according to the embodiment of present invention includes step S100 of forming, on the substrate that is made of glass or transparent resin material, the source electrode 31, the light shielding layer 2 and the drain electrode 32, which are separated from each other in that order, as shown in FIG. 2a, by means of a single mask (not shown) through a single patterning process. In an exemplary embodiment of the present invention, the source electrode 31, the light shielding layer 2, the drain electrode 32 and a data line (not shown) electrically connected the source electrode 31 are formed on the substrate 1 by using a single mask through a single patterning process.

In an embodiment of the present invention, a patterning process mainly includes procedures of substrate cleaning, filming, photoresist coating, exposing, developing, etching, photoresist stripping, and the like. For example, the step of forming the source electrode 31, the light shielding layer 2, the drain electrode 32 and the data line (not shown) electrically connected the source electrode 31 on the substrate 1 by using a single mask through a single patterning process includes: forming a metal film on the substrate 1 by using a process such as magnetron sputtering or thermal evaporation; coating a photoresist layer on the metal film; exposing the photoresist layer by means of a first mask having patterns corresponding to the source electrode, the light shielding layer, the drain electrode and the data line respectively, so as to form a photoresist remained area and a photoresist removed area; removing the photoresist removed area and remaining the photoresist remained area by a development process; removing the metal film within the photoresist removed area by an etching process; and, stripping the photoresist within the photoresist remained area. In addition, the remained phtoresist may be removed by an ashing process. In this way, the source electrode 31, the light shielding layer 2, the drain electrode 32 and the data line (not shown) may be formed on the substrate 1, as shown in FIG. 2a. In the step S100, the metal film used may be made of a material such as molybdenum, aluminium, aluminium-nickel alloy, chromium or copper, and may be also made of a random combination of these materials. The light shielding layer 2 is disposed between the source electrode 31 and the drain electrode 32 and is located to correspond to the active layer 5 in position so as to block light from the substrate 1 from illuminating the active layer 5, thereby maintaining electrical characteristic of the active layer 5 formed by the poly-silicon film. For example, the light shielding layer 2 may be formed by a chromium film or a molybdenum film.

As shown in FIG. 2b, the method of manufacturing the substrate according to the embodiment of the present invention further includes:

Step S200: forming a first insulating layer 41 and an amorphous silicon film 51 covering the source electrode 31, the light shielding layer 2 and drain electrode 32 on the substrate 1 by using, for example, a chemical vapor deposition (CVD) process. The first insulating layer 41 may be made of, for example, SiN (silicon nitride), SiOx (silicon oxide), or the like. The amorphous silicon film 51 is transformed into a low temperature poly-silicon film through an excimer laser annealing process, which film is used to form the active layer 5 of the thin film transistor.

As shown in FIG. 2c, the method of manufacturing the substrate according to the embodiment of the present invention further includes:

Step S300: forming a second insulating layer 42 covering the active layer 5 on the first insulating layer 41, for example, by a chemical vapor deposition (CVD) process;

Step S400: forming a gate electrode 33 on the second insulating layer 42, for example, by a patterning process; and Step S500: forming a third insulating layer 43 covering the gate electrode 33 on the second insulating layer 42.

The method of manufacturing the substrate according to the embodiment of the present invention may further include:

Step S600: forming through holes 9 in the first, second and third insulating layers to electrically connect the active layer 5 and the source electrode 31 and the drain electrode 32.

According to an exemplary embodiment of the present invention, as shown in FIG. 2c, posterior to forming the gate electrode 33 and the second insulating layer 42 covering the active layer 5 on the first insulating layer 41, doped ohmic contact areas 61 are respectively formed through an implanting process, such as electron gun bombardment, in portions of the active layer 5 electrically connected to the source electrode 31 and the drain electrode 32. The doped ohmic contact areas 61, which, for example, are doped with phosphor or boron, may render reduced contact resistance between the source electrode 31 and the drain electrode 32 and the active layer 5 and the pixel electrode 7.

The thin film transistor may be a P-type thin film transistor or an N-type thin film transistor. As for an N-type thin film transistor, as shown in FIG. 2d, after the doped ohmic contact areas 61 have been formed, light doped drain areas 62 are formed adjacent to the doped ohmic contact areas 61 by ashing a photoresist and then lightly doping the active layer by using the ashed photoresist as a mask. The light doped drain areas 62 may prevent hot electrode degradation effect and thus render extended hot carriers lifetime of the thin film transistor.

Figure 2E:
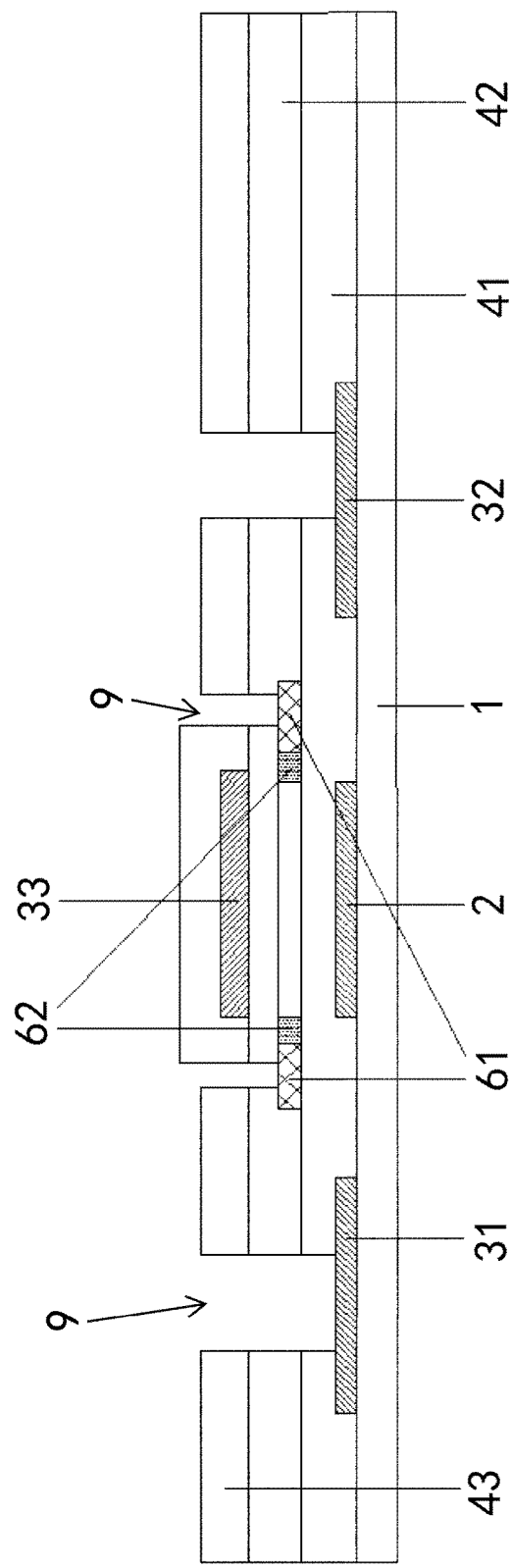
Figure 2F:
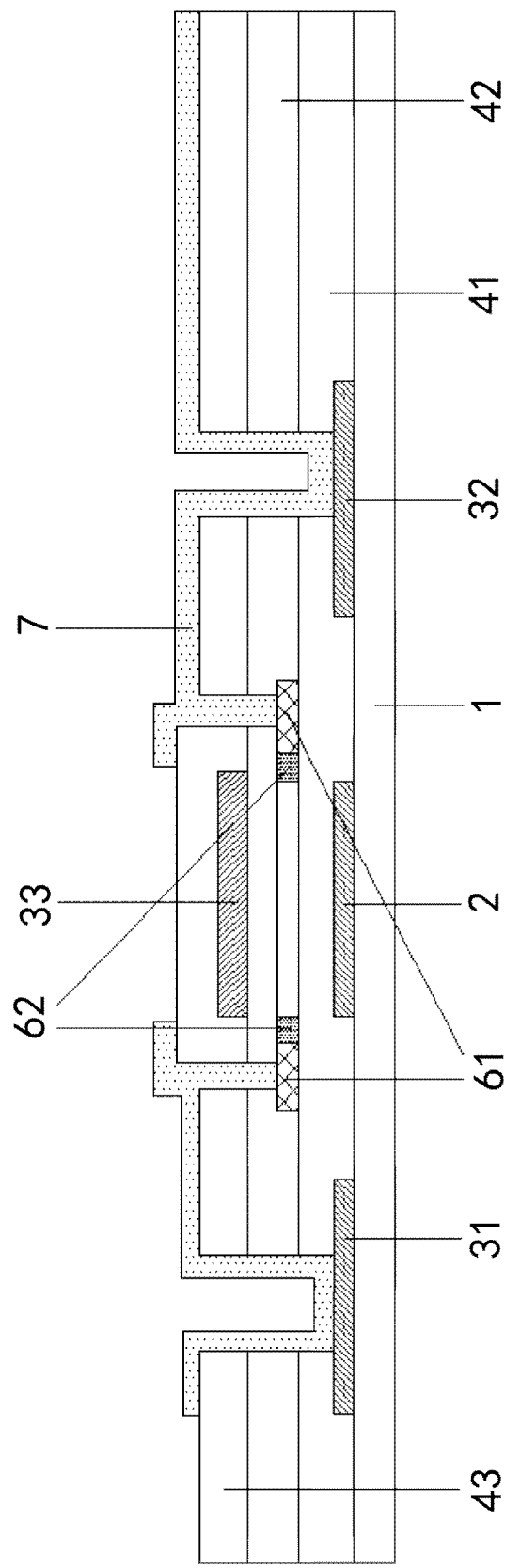

In an exemplary embodiment of the present invention, the step of forming through holes 9 in the first, second and third insulating layers to electrically connect the active layer 5 with the source electrode 31 and the drain electrode 32 may include: forming a pixel electrode 7, which is electrically connected to the drain electrode 32, on the third insulating layer 43. Specifically, as shown in FIG. 2e, the through holes 9 are formed in the first insulating layer 41, the second insulating layer 42 and the third insulating layer 43 by a patterning process; as shown in FIG. 2f, an ITO film or other electrically conductive material film is coated on the third insulating layer 43 and in the through holes 9 by a sputtering process, thereby electrically connecting the active layer 5 with the source electrode 31 and the drain electrode 32, and the ITO film or other electrically conductive material film, through a patterning process by a single mask, is also formed into the pixel electrode 7. In an exemplary embodiment, the data line and the pixel electrode 7 may be formed on the third insulating layer 43 through a single patterning process and electrically connected to the source electrode 31.

Figure 2G:
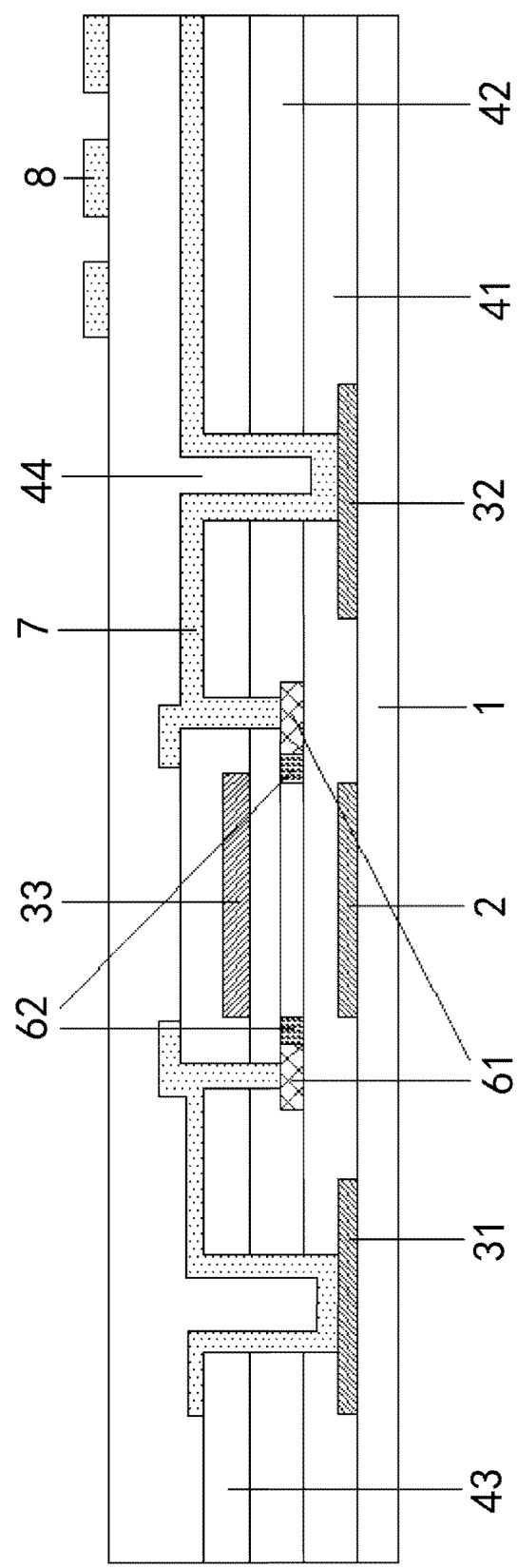

Further, as shown in FIG. 2g, a fourth insulating layer 44 is formed to cover the pixel electrode 7, on the third insulating layer 43 by a CVD process, and an ITO film of other electrically conductive material film is coated on the fourth insulating layer 44 by a sputtering process and is formed as at least one common electrode 8 through a patterning process. In this way, the array substrate according to the embodiment of the present invention may be obtained.

It is understood the second insulating layer 42, the third insulating layer 43 and the fourth insulating layer 44 each may be formed, for example, by SiN (silicon nitride), SiOx (silicon oxide), or the like. In addition, before the step S100, a buffer layer may be formed on the substrate 1 to improve surface flatness and adhesion of the substrate 1 and further enhance water-oxygen permeability resistance. The buffer layer may be formed, for example, by SiN (silicon nitride), SiOx (silicon oxide), or the like.

According to an embodiment of the present invention, there is a display device, comprising the array substrate of any of the above embodiments as described. The display device may be a liquid crystal display device. The liquid crystal display device may perform displaying function under driving of the thin film transistors on the array substrate. In an alternative embodiment, the array substrate according to the embodiments of the present invention may be applied in an organic light emitting diode (OLED) display device and an active matrix organic light emitting diode (AMOLED) display device. The display device may be any product or component that has a displaying function, such as a mobile phone, a tablet computer, a television, a display, a notebook computer, a digital photo frame, navigator or the like.

In the thin film transistor assembly, the array substrate and the method of manufacturing the same, and the display device including the array substrate according to the above embodiments of the present invention, the light shielding layer, the source electrode and the drain electrode of the thin film transistor and the data line may be formed in the same layer on the substrate by using the same material through a single patterning process, so that times of performing patterning processes and the number of masks used are reduced, which renders simplified manufacturing process of the array substrate and reduced manufacturing cost.

Although several exemplary embodiments have been shown and described for illustrate the aim, technical scheme and advantages of the present invention, it would be appreciated by those skilled in the art that these embodiments are only examples of the present invention, and are not used to limit the present invention, and furthermore, various changes or modifications may be made in these embodiments without departing from the principles and spirit of the present invention, the scope of which is defined in the claims and their equivalents.

The invention claimed is:

1. A thin film transistor assembly, comprising:
a thin film transistor; and
a light shielding layer, arranged between a source electrode and a drain electrode of the thin film transistor and configured to block exterior light from illuminating an active layer of the thin film transistor,
wherein the light shielding layer and the source electrode and the drain electrode of the thin film transistor are formed in the same layer.

2. The thin film transistor assembly according to claim 1, wherein the light shielding layer and the source electrode and drain electrode of the thin film transistor are formed by the same material layer through a single patterning process.

3. The thin film transistor assembly according to claim 1, wherein the thin film transistors are top gate thin film transistors.

4. The thin film transistor assembly according to claim 1, wherein the active layer is formed by a poly-silicon film.

5. The thin film transistor assembly according to claim 4, wherein doped ohmic contact areas are respectively provided in portions of the active layer electrically connected to the source electrode and drain electrode.

6. The thin film transistor assembly according to claim 5, wherein the thin film transistors are N-type thin film transistors.

7. The thin film transistor assembly according to claim 6, wherein light doped drain areas are provided adjacent to the doped ohmic contact areas.

8. An array substrate, comprising:
a substrate; and a plurality of thin film transistor assemblies according to claim 1, which are formed on the substrate;

wherein the light shielding layer and the source electrode and drain electrode of the thin film transistor are formed in the same layer on the substrate.

9. The array substrate according to claim 8, wherein the light shielding layer and the source electrode and drain electrode of the thin film transistor are formed on the substrate by the same material layer through a single patterning process.

10. The array substrate according to claim 8, wherein each of the source electrodes of the thin film transistors is connected to a corresponding data line, and the data line, the light shielding layer, the source electrode and the drain electrode are formed in the same layer on the substrate.

11. A display device, comprising the array substrate according to claim 8.

12. A method of manufacturing an array substrate, the array substrate comprising:
   a substrate;
   a plurality of thin film transistors, which are formed on the substrate; and
   a plurality of light shielding layers, each of which is disposed on the substrate between a source electrode and a drain electrode of the thin film transistor and is configured to block light from the substrate from illuminating an active layer of the corresponding thin film transistor,
   the method comprising a step of:
   forming, on the substrate, the source electrode, the light shielding layer and the drain electrode, which are spaced apart from one another in that order, by using a single mask through a single patterning process.

13. The method according to claim 12, wherein, posterior to the step of forming, on the substrate, the source electrode, the light shielding layer and the drain electrode, which are spaced apart from one another in that order, by using a single mask through a single patterning process, the method further comprising:
   forming a first insulating layer covering the source electrode, the light shielding layer and the drain electrode on the substrate;
   forming the active layer on the first insulating layer;
   forming a second insulating layer covering the active layer on the first insulating layer;
   forming a gate electrode on the second insulating layer;
   forming a third insulating layer covering the gate electrode on the second insulating layer; and
   forming through holes in the first, second and third insulating layers to electrically connect the active layer with the source electrode and the drain electrode.

14. The method according to claim 13, wherein the thin film transistors are top gate thin film transistors and the active layer is formed by a low temperature poly-silicon film.

15. The method according to any of claim 12, wherein,
   the step of forming, on the substrate, the source electrode, the light shielding layer and the drain electrode, which are spaced apart from one another in that order, by using a single mask through a single patterning process comprises a step of:
   forming, on the substrate, the source electrode the light shielding layer, the drain electrode, and the data line that is electrically connected to the source electrode by using a single mask through a single patterning process.

16. The method according to claim 15, wherein the step of forming, on the substrate, the source electrode the light shielding layer, the drain electrode, and the data line that is electrically connected to the source electrode by using a single mask through a single patterning process comprises:
   forming a metal film on the substrate;
   coating a photoresist layer on the metal film;
   exposing and developing the photoresist layer by means of a first mask having patterns corresponding to the source electrode, the light shielding layer, the drain electrode and the data line respectively;
   removing the metal film within a photoresist removed area by an etching process; and
   stripping remained photoresist.

17. The method according to claim 13, wherein after having forming the gate electrode and the second insulating layer covering the active layer on the first insulating layer, doped ohmic contact areas are respectively formed in portions of the active layer electrically connected to the source electrode and the drain electrode through an ion implanting process.

18. The method according to claim 17, wherein the thin film transistors are N-type thin film transistors and, after the doped ohmic contact areas have been formed, light doped areas are formed adjacent to the doped ohmic contact areas.

19. The method according to claim 13, wherein forming through holes in the first, second and third insulating layers to electrically connect the active layer with the source electrode and the drain electrode includes:
   forming a pixel electrode, which is electrically connected to the drain electrode, on the third insulating layer.

* * * * *